(12) United States Patent
Brandorff

(10) Patent No.: US 7,388,392 B2
(45) Date of Patent: Jun. 17, 2008

(54) DIE DESIGN WITH INTEGRATED ASSEMBLY AID

(75) Inventor: Alexander Brandorff, New Milford, CT (US)

(73) Assignee: Wentworth Laboratories, Inc., Brookfield, CT (US)

( * ) Notice: Subject to any disclaimer, the term of this patent is extended or adjusted under 35 U.S.C. 154(b) by 0 days.

(21) Appl. No.: 11/872,433

(22) Filed: Oct. 15, 2007

(65) Prior Publication Data

US 2008/0084227 A1 Apr. 10, 2008

Related U.S. Application Data

(63) Continuation of application No. 10/987,039, filed on Nov. 12, 2004, now Pat. No. 7,282,936.

(60) Provisional application No. 60/519,966, filed on Nov. 14, 2003.

(51) Int. Cl.
*G01R 31/02* (2006.01)

(52) U.S. Cl. ............... 324/761; 324/754; 324/758

(58) Field of Classification Search ............ None
See application file for complete search history.

(56) References Cited

U.S. PATENT DOCUMENTS 6,297,657 B1 * 10/2001 Thiessen et al. ............ 324/761
6,633,175 B1 * 10/2003 Evans et al. ................ 324/754

* cited by examiner

Primary Examiner—Minh N Tang
(74) Attorney, Agent, or Firm—Wiggin and Dana LLP; Anthony P. Gangemi; Gregory S. Rosenblatt

(57) ABSTRACT

An upper die portion of a die head for aligning probe pins in first array of first micro-holes formed in lower die portion of the die head, which generally includes a spacer portion and is adapted to contact lower die portion is typically positioned between second surface and support frame and includes a second array of second micro-holes adapted to receive probe pins generally is in contact or close proximity to first assembly aid film and has a third array of third micro-holes adapted to receive probe pins and third array of third micro-holes are patterned to align with one another but are both offset with first array of first micro-holes by approximately the lateral distance between probe tip and probe head.

25 Claims, 4 Drawing Sheets

DIE DESIGN WITH INTEGRATED ASSEMBLY AID

CROSS REFERENCE TO RELATED APPLICATION

This application claims the benefit of U.S. application Ser. No. 10/987,039, filed Nov. 12, 2004, now U.S. Pat. No. 7,282,936 which claims the benefit of U.S. Provisional Application No. 60/519,966, filed Nov. 14, 2003, each of which is hereby incorporated by reference as if fully disclosed herein in its entirety.

BACKGROUND OF THE INVENTION

1. Field of the Invention

This invention relates to a vertical pin integrated circuit probing device, and more particularly to an assembly apparatus and method for loading probe pins into a die head assembly of the vertical pin integrated circuit probing device.

2. Description of the Related Art

U.S. Pat. Nos. 6,297,657 and 6,633,175 illustrate vertical pin probing devices and are incorporated by reference as if fully disclosed in their entireties herein.

One type of vertical pin probing devices utilizes a buckling beam die design. As described in U.S. Pat. No. 6,297,657, an integrated circuit or other device under test is supported on a movable chuck. The integrated circuit typically has a pattern or matrix of contact pads to be simultaneously probed by a vertical-pin integrated circuit probing device, such as the probe head sold under the brand name COBRA® by Wentworth Laboratories of Brookfield, Conn. The probing device includes a lower die with a group of holes and an upper die with a group of holes separated by a spacer and carrying multiple vertical pin probes. The die materials are typically made of a plastic insulating material such as those sold under the brand name Delrin®, an acetal resin that is a registered trademark E.I. duPont de Nemours & Co of Wilmington, Del., a low expansion metal such as those sold under the brand name Invar®, a nickel alloy that is a registered trademark of Imphy, S.A., or a ceramic such as silicon nitride.

Each probe pin has a probe tip that protrudes from a hole in the lower face of the lower die and an exposed head that protrudes from holes in the upper side of upper die. Holes containing opposing ends of the vertical probe pins are slightly offset from one another and the probe pins are curved in a snake-like configuration to promote buckling, so as to create substantially uniform contact pressure on the integrated circuit pads despite any slight vertical unevenness or misalignment.

With reference to FIG. 1, a partially-assembled portion of a buckling beam die 10 as known in the prior art includes of a lower die 12, probe pins 14, and an assembly aid film 16. Lower die 12 contains an array of micro-holes 18 into which probe tips 20 are inserted. Assembly aid film 16 contains a matching pattern of micro-holes 22 punched into the film. One edge 24 of a small piece of assembly aid film 16 is adhered, e.g., using tape or similar, to top 26 of lower die 12 so that it is approximately positioned over micro-holes 18. Each probe tip 20 is inserted into one of lower die micro-hole 18, and then probe head 28 is inserted up through a corresponding micro-hole 22 in assembly aid film 16 to hold probe pin 14 in position. This process is continued until each of probe pins 14 are in place. Insertion of probe heads 28 requires lifting assembly aid film 16 to provide sufficient clearance to slip each probe head under the film and up through the proper one of micro-holes 18. As the assembly proceeds, it is necessary to tie down assembly aid film 16 periodically to prevent it from lifting up off probe heads 28 of the contacts that have already been installed. Regardless, assembly aid film 16 occasionally lifts off probe heads 28 resulting in the need for a partial or complete re-assembly. The process of fitting probe heads 28 up through micro-holes 22 in assembly aid film 16 also presents opportunities for each of probe pins 14 to be inadvertently bent.

After each of probe pins 14 have been loaded into lower die 12 and assembly aid film 16, it is necessary to cut the film so that it fits entirely inside an upper die cavity, and to remove the tie-down wires. This process often results in assembly aid film 16 lifting off one or more of probe heads 28, again requiring a partial or complete re-build of the assembly. After assembly aid film 16 has been cut and the wires removed, it is necessary to install an upper die 30. As shown in FIG. 2, this requires aligning upper die 30, which has an array of micro-holes 32 matching the pattern of micro-holes 18 and 22 in lower die 12 and assembly aid film 16, respectively, over array of probe pins 14 such that each of probe heads 28 lines up with a respective one of the micro-holes in the upper die. This is a delicate operation, as typically each of thousands of probe pins 14 must pass through one of micro-holes 32 simultaneously in order to avoid bending probe pins. Consequently, each of micro-holes 32 in upper die 30 are larger than those in lower die 12 and in assembly aid film 16 to facilitate assembly. Also, still referring to FIG. 2, upper die 30 is conventionally made by starting with a round disk of polyimide material of approximately 0.1 inch thickness, and milling out a cavity 34 leaving a thin "web" on the order of 0.010" thick through which the pattern defining array of micro-holes 32 is drilled. It is often difficult to keep such a thin web of material flat across the array due to unbalanced internal stresses in the material after milling, moisture absorption, etc., and may result in a relatively low yield rate for upper dies.

After upper die 30 is installed, alignment pins (not shown) are inserted to correctly align the upper die with lower die 12 dies, and screws (not shown) are installed to hold the upper and lower dies together. Probe heads 32 are then lapped in order to arrive at a consistent over-all probe pin length throughout the array. One consequence of the lapping process is that lapping debris passes through over-sized micro-holes 32 in upper die 30 and collects on assembly aid film 16 inside the head assembly. This debris is conductive and must be removed to avoid electrical shorting between contacts. It is therefore necessary to remove upper die 30 after lapping in order to adequately remove the debris. The removal of upper die 30 presents a further opportunity for assembly aid film 16 to lift off probe heads 28, requiring a partial or full re-build of the assembly. It also requires upper die 30 alignment and assembly to be repeated, presenting another opportunity for bending probe pins 14 if alignment is not perfect.

One of the advantages of buckling beam technology is repair-ability. Since the probe pins are not permanently bonded to the test electronics, it is possible to replace damaged probe pins rather than discard the entire assembly. The repair process with the conventional design as illustrated in FIG. 2 may be problematic. The repair process requires removal of upper die 30 to gain access to probe pins 14. A damaged one of probe pins 14 is then extracted by pulling it through assembly aid film 16, and re-inserting a new probe pin through the same assembly aid film hole. There are several problems that may arise when using this technique. First, the removal of upper die 30 may cause assembly aid film 16 to lift off one or more of probe heads. Static electricity sometimes results in assembly aid film 16 adhering to the underside of upper die 30 and coming completely off the array, resulting in the need for a complete re-build.

Assuming upper die 30 is successfully removed, any of probe pins 14 that are damaged must then be withdrawn through assembly aid film 16. Since micro-holes 22 in assembly aid film 16 are "tight", e.g., with a diameter on the order of 0.0001 inch larger than the diameter of typical probe pin 14, the assembly aid film must be slightly torn in order for the probe pin "swage" to pass through the film. This "tugging" on assembly aid film 16 presents another opportunity for the film to lift off of one or more of probe pins 14.

Assuming a damaged one of probe pins 14 is successfully removed and another probe pin inserted, the particular one of micro-holes 22 in assembly aid film 16 is now enlarged, causing potential difficulties in aligning the new probe pin with its associate micro-hole 32 in upper die 30. Also, enlarged one of micro-holes 22 in assembly aid film 16 allows probe pin 14 more freedom of movement, which may allow it to contact a neighboring probe pin in tight tolerance applications resulting in an electrical short circuit.

SUMMARY OF THE INVENTION

One aspect of the present invention is an upper die portion of a die head for aligning probe pins in a first array of first micro-holes formed in a lower die portion of the die head, which includes a spacer portion including first and second surfaces, the first surface adapted to contact the lower die portion, a support frame, a first assembly aid film positioned between the second surface and the support frame, and having a second array of second micro-holes adapted to receive the probe pins.

Another aspect of the present invention is a die head including alignment mechanisms for aligning probe pins in the die head, which includes a lower die portion having multiple surfaces, at least one of the multiple surfaces having a first array of first micro-holes adapted to receive the probe pins, an upper die portion having a spacer portion, a support frame, and a first assembly aid film, the spacer portion including first and second surfaces, the first surface in contact with at least one of the multiple surfaces of the lower die portion, the first assembly aid film positioned between the second surface and the support frame, and the first assembly aid film having a second array of second micro-holes adapted to receive the probe pins.

Still another aspect of the present invention is an upper die portion of a die head for aligning probe pins in a first array of first micro-holes formed in a lower die portion of the die head, which includes a spacer portion including first and second surfaces, the first surface adapted to contact the lower die portion, a first support frame positioned above the second surface, an assembly aid film having a second array of second micro-holes adapted to receive the probe pins, a second support frame positioned above the first support frame and the assembly aid film, and a sheet joined with the second support frame and having a third array of third micro-holes adapted to receive the probe pins.

Yet another aspect of the present invention is a method of replacing a probe pin in a die head having upper and lower portions, which includes the following steps: grasping the probe pin; removing the probe pin from the die head by pulling the probe pin upwardly and out of the upper and lower portions; and inserting a probe pin in the same location as the probe pin removed in the removing step by inserting the probe pin downwardly through both upper and lower portions.

Still another aspect of the present invention is a method of assembling probe pins in a die head having upper and lower portions, which includes the following steps: removing at least one of at least one assembly aid film and a sheet, each having an array of micro-holes, the at least one assembly aid film adapted to reside above the upper portion for maintaining the position of the probe pins in the die head by containing each probe pin in one of the micro-holes; inserting one or more probe pins downwardly through both upper and lower portions; and replacing the at least one assembly aid film and sheet removed in the removing step, wherein each of the one or more probe pins inserted in the die head are encircled by one of the array of micro-holes.

BRIEF DESCRIPTION OF THE DRAWINGS

For the purpose of illustrating the invention, the drawings show a form of the invention that is presently preferred. However, it should be understood that the present invention is not limited to the precise arrangements and instrumentalities shown in the drawings, wherein.

DETAILED DESCRIPTION

Figure 1:
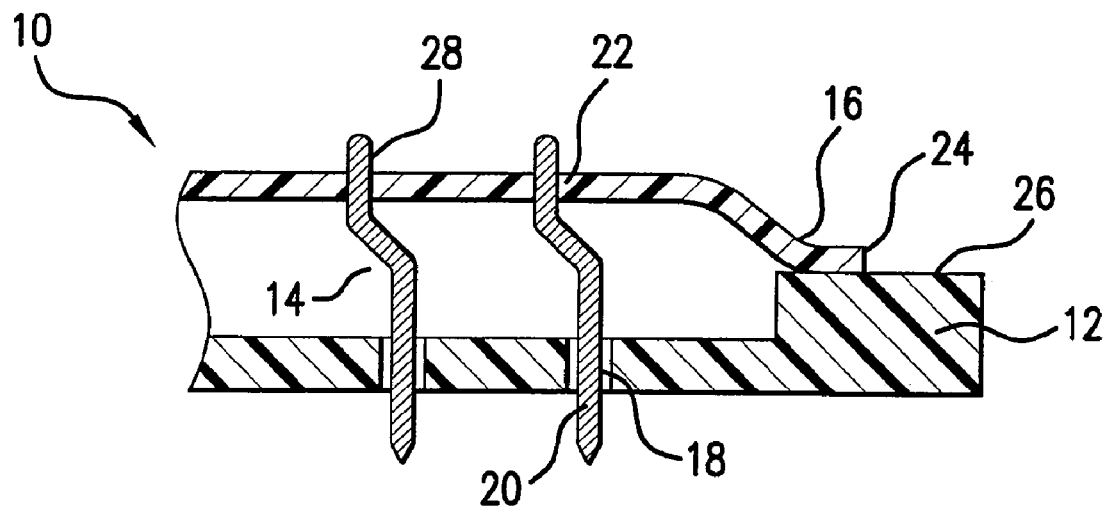
FIG. 1 is a cross-section of a partially-assembled buckling beam die known in the prior art.
Figure 2:
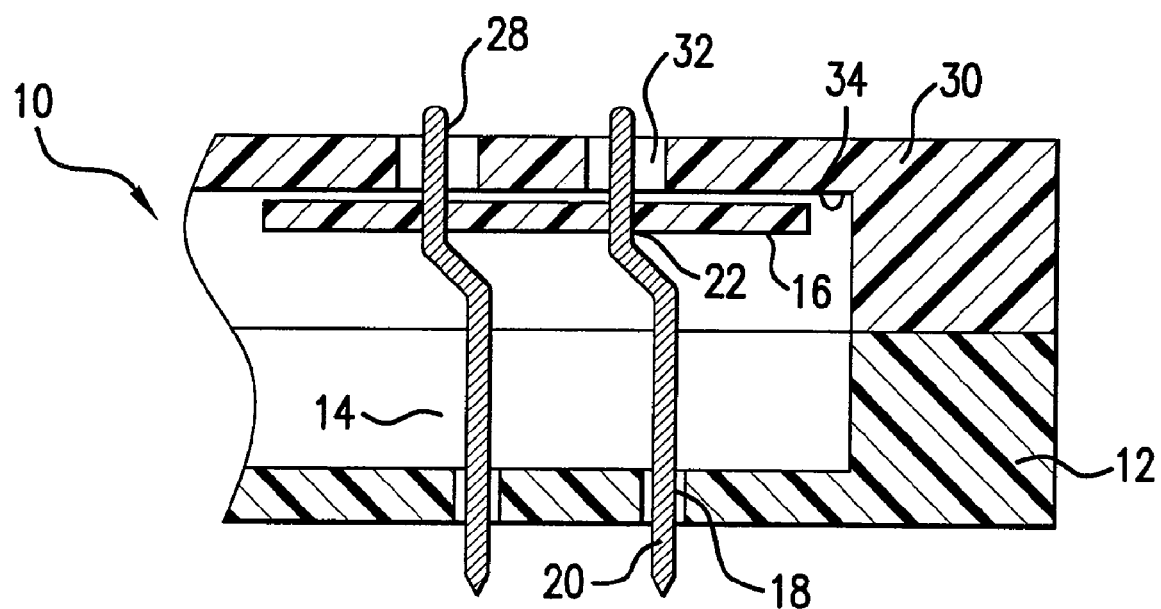
FIG. 2 is a cross-section of a fully-assembled buckling beam die known in the prior art.
Figure 3:
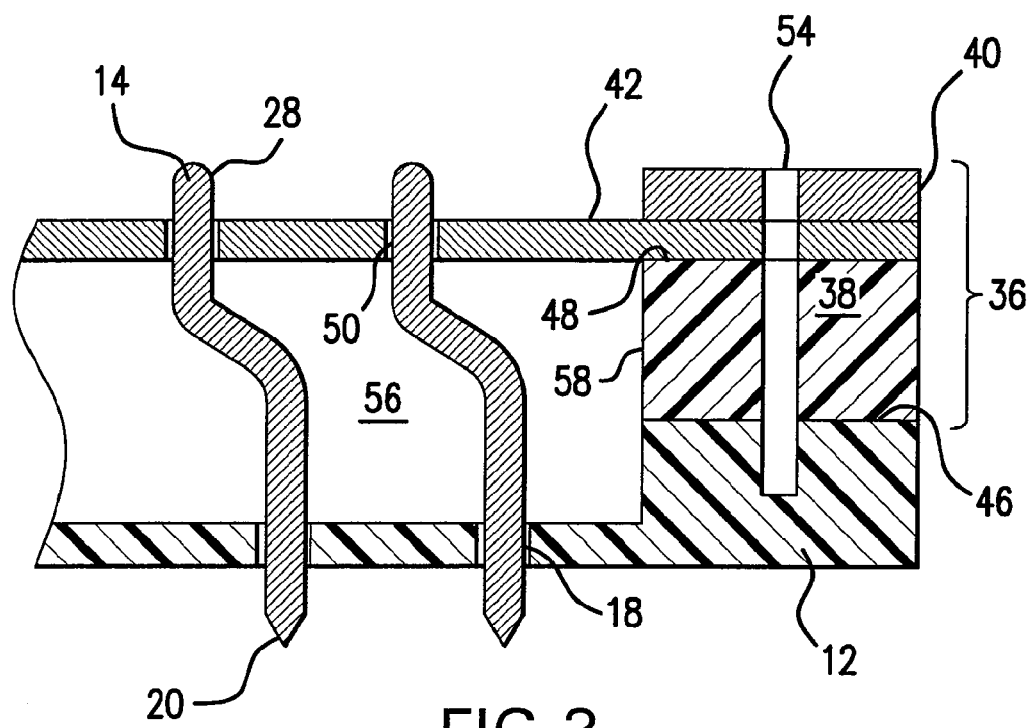
FIG. 3 is a cross-section of a partially-assembled buckling beam die according to one embodiment of the present invention.
Figure 4:
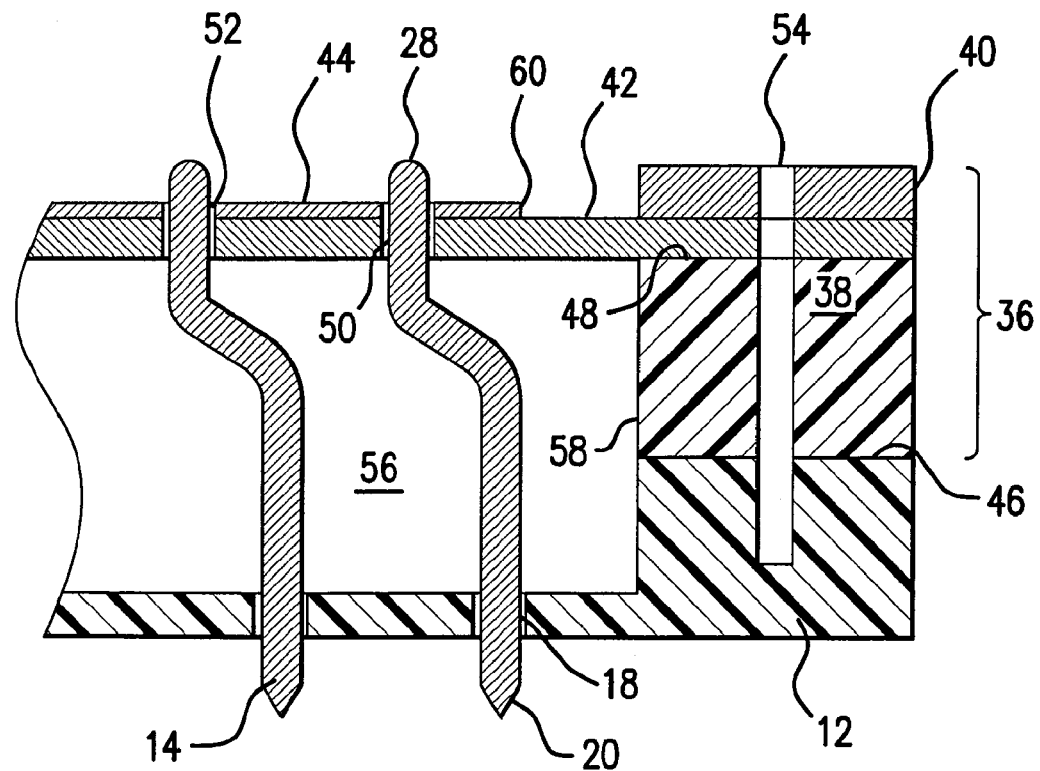
FIG. 4 is a cross-section of a fully-assembled buckling beam die according to one embodiment of the present invention.

Referring now to FIGS. 3-8 in which like reference numerals indicate like parts, and in particular to FIGS. 3 and 4, one embodiment of the present invention includes an upper die portion 36 of a die head for aligning probe pins 14 in first array of first micro-holes 18 formed in lower die portion 12 of the die head. Upper die portion 36 generally includes a spacer portion 38, a support frame 40, and first and second assembly aid films 42 and 44, respectively.

Spacer portion 38 includes first and second surfaces 46 and 48, respectively. First surface 46 is adapted to contact lower die portion 12. Spacer portion 38 is typically an annular configuration having a square or rectangular cross-section and may be formed from any materials known to be suitable as a die portion, e.g., a fiber-filled epoxy, a low expansion metal, or a ceramic.

Support frame 40 is typically formed from a metal foil such as a low expansion nickel alloy, e.g., sold under the brand name Invar® or similar. Support frame 40 is typically similar in shape to spacer 38 but with a smaller dimension with respect to the longitude of each of probe pins 14.

First assembly aid film 42 is typically positioned between second surface 48 and support frame 40 and includes a second array of second micro-holes 50 adapted to receive probe pins 14. Second assembly aid film 44 generally is in contact or close proximity to first assembly aid film 42 and has a third array of third micro-holes 52 adapted to receive probe pins 14.

Second array of second micro-holes 50 and third array of third micro-holes 52 are patterned to align with one another but at an offset with first array of first micro-holes 18 in lower die 12. The amount of offset is determined by the offset of each of probe pins 14, i.e., the lateral distance between probe tip 20 and probe head 28. Each of the micro-holes in second array of second micro-holes 50 of first assembly aid film 42 are generally over-sized, e.g., typically having a diameter approximately 0.5 mil (0.0005 inch) larger than the diameter of probe pins 14, which is smaller than micro-holes 22 in upper die 30 of the prior art. Each of the micro-holes in third array of third micro-holes 52 of second assembly aid film 44 are generally smaller than the micro-holes in first assembly aid film 42, e.g., typically having a diameter about 0.1 mil (0.0001 inch) larger than the diameter of each of probe pins 14 so that the probe pins can be held in close relative alignment to each other and that each of the third micro-holes is effectively sealed to prevent debris from entering the die head.

First assembly aid film 42 may also include alignment holes 54, which are intended to engage a dowel or similar structure (not shown) for aligning the components of upper die portion 36 with lower die 12. Additional structural rigidity may be provided to upper die portion 36 by bonding first assembly aid film 42 to support frame 40 and spacer portion 38 using commercially available adhesives, e.g., 3M 2290 Structural Adhesive (3M, St. Paul, Minn.) or similar.

First and second assembly aid films 42 and 44 may be any suitable polymer film, e.g., of the type formed from a polyimide, and are both typically at least semi-transparent. First assembly aid film 42 generally creates a taut "drum skin" across an aperture 56 that includes a perimeter 58, which is defined within the die head and support frame 40, thereby eliminating the non-flatness problem inherent in conventional designs. Second assembly aid film 44 is generally smaller in diameter than first assembly aid film 42 and has an outer perimeter 60 that is smaller than perimeter 58 of aperture 56. As a result, second assembly aid film 44 is typically not connected with support frame 40 and instead may float on top first assembly aid film 42.

Figure 5:
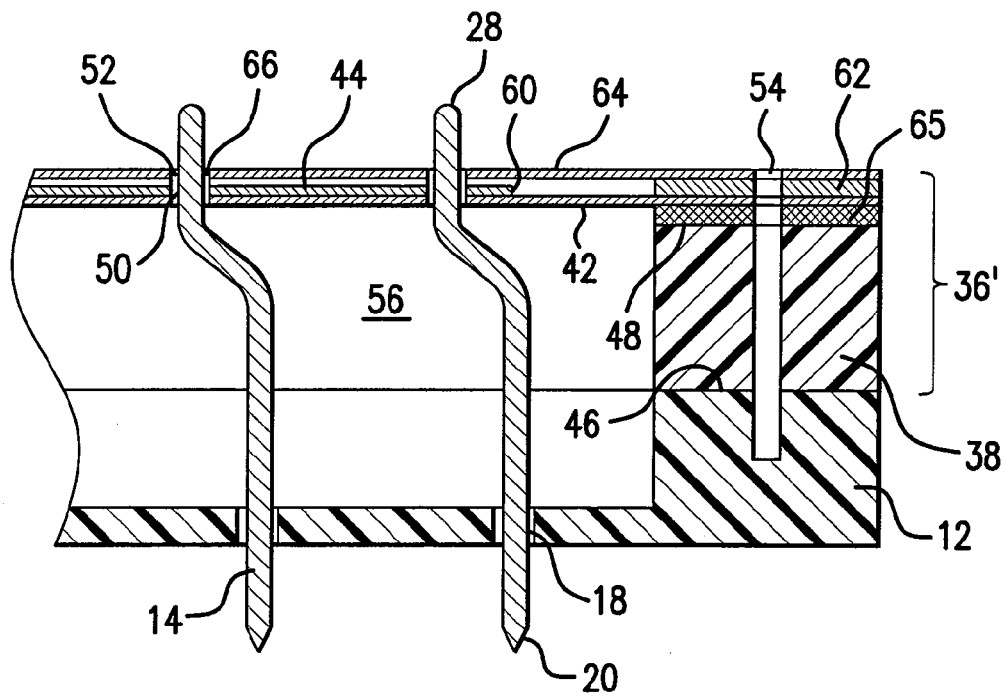
FIG. 5 is a cross-section of a fully-assembled buckling beam according to one embodiment of the present invention.

Referring now to FIG. 5, in an alternative embodiment, an upper die portion 36' includes a thin shim 62, which is typically installed around outer perimeter 60, and a polymer sheet 64, which is positioned above second assembly aid film 44, typically on top of the shim. Shim 62 is typically installed on top of first assembly aid film 42, which may be mounted to a rigid mounting portion 65 adjacent its perimeter. Mounting portion 65 rests on top of surface 48 of spacer portion 38. Shim 62 allows free movement of second assembly film 44 after all the probe pins are loaded and the second assembly aid film is installed as above. Polymer sheet 64 provides additional rigidity and stability to upper die portion 36'. Polymer sheet 64 is typically formed from a polyimide of approximately 6 mils thickness and has over-sized, typically drilled, micro-holes 66. Polymer sheet 64, spacer portion 38, and shim 62 may be aligned using alignment holes 54 and dowel pins (not shown). Polymer sheet 64 is removable for head repair and may be tightly fastened by attaching to shim 62 and spacer 38 using screws or similar. In the embodiment illustrated in FIG. 5, lower die portion 12 and upper die portion 36' include four arrays of micro-holes, i.e., first array of first micro-holes 18, second array of second micro-holes 50, third array of third micro-holes 66, and fourth array of fourth micro-holes 52.

Figure 6:
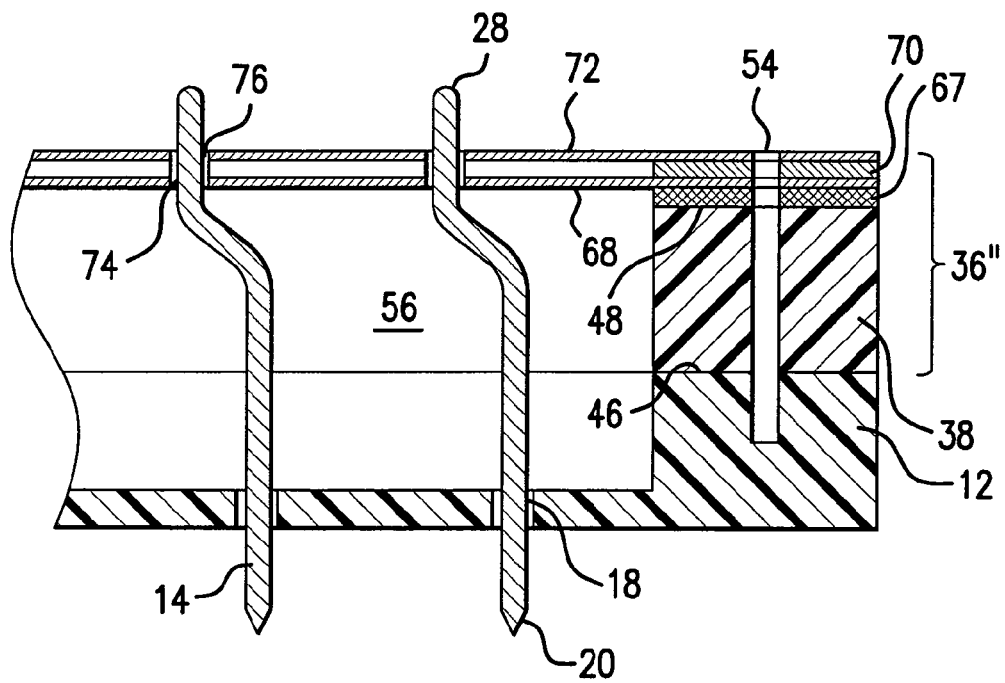
FIG. 6 is a cross-section of a fully-assembled buckling beam die according to one embodiment of the present invention.

Referring now to FIG. 6, in another embodiment, an upper die portion 36" includes spacer portion 38, a first support frame 67, an assembly aid film 68, a second support frame 70, and a sheet 72. Spacer portion 38 includes first and second surfaces 46 and 48, respectively. First surface 46 is adapted to contact lower die portion 12. First support frame 67 is positioned adjacent said second surface 48 and typically holds assembly aid film 68 taut. Assembly aid film 68 includes a second array of second micro-holes 74 adapted to receive probe pins 14. Assembly aid film 68 is generally at least semi-transparent. Second support frame 70 is positioned above said first support frame 67 and said assembly aid film 68. Sheet 72 is typically joined with second support frame 70 and includes a third array of third micro-holes 76 adapted to receive probe pins 14. Sheet 72 is typically formed from a polyimide of approximately 6 mills thickness. Third array of third micro-holes 76 are typically over-sized, i.e., larger than the diameter of probe pins 14. As in above-described embodiments, second and third arrays 72 and 74, respectively, are adapted to be offset from first array 18.

Figure 7:
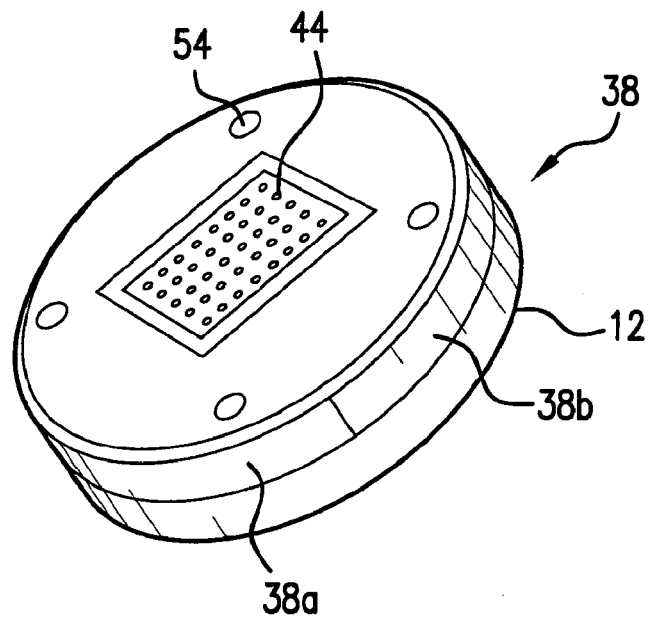
FIG. 7 is a top isometric view of an assembled buckling beam die according to one embodiment of the present invention.
Figure 8:
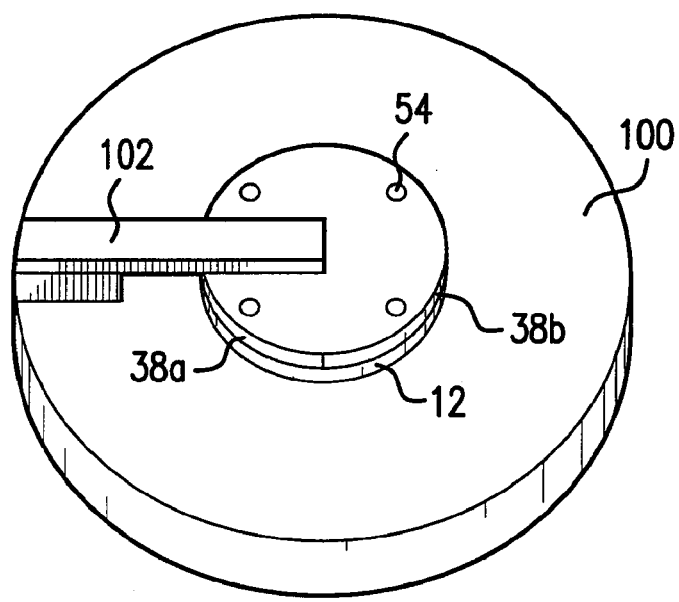
FIG. 8 is an assembly aid for use in assembly the buckling beam dies of the present invention.

Referring now to FIGS. 7 and 8, in another embodiment of the present invention, spacer portion 38 may include at least first and second portions, 38a and 38b, respectively, which may be separated from one another to facilitate withdrawal and insertion of the spacer portion. Assembly could then take place with first assembly aid film 42 in close proximity to lower die portion 12. Each of probe tips 20 are passed through the assembly aid film micro-holes and lower die portion micro-holes nearly simultaneously. Referring now to FIG. 8, after all of probe pins 14 have been loaded, the die head is placed in a fixture 100 that has a plate 102 positioned over the heads of the contacts (not shown) to prevent the contacts from lifting out of lower die portion 12. First assembly aid film 42 may then be raised to its final elevation. The process of raising first assembly aid film 42 generally aligns all the contacts. Spacer halves 38a and 38b may then be inserted between first assembly aid film 42 and lower die portion 12, and the entire die head may be pinned and screwed together utilizing alignment holes 54.

Another aspect of the present invention is a method of replacing a probe pin in a die head having upper and lower portions. First, sheet 64, 72 is removed. In addition, if present, at least one assembly aid film having an array of micro-holes is removed. Next, probe head 28 of the probe pin 14 to be replaced is grasped using a tweezers or other appropriately-sized tool. The respective probe pin 14 is then removed from the die head by pulling the probe pin upwardly and out of upper and lower portions 36 and 12, respectively. Next, a replacement probe pin 14 is inserted inserting in the same location as the probe pin removed by inserting the probe pin downwardly through both upper and lower portions 36 and 12, respectively. Then, if present, the at least one assembly aid film previously removed is replaced and sheet 64, 72 is replaced.

Still another aspect of the present invention is a method of assembling probe pins 14 in a die head. After upper die portion 36 is secured to lower die portion 12 using screws, dowels, or the like, each of probe pins 14 are loaded by passing each probe tip 20 and body of the probe pin through the over-sized micro-holes in assembly aid films (42 or 68) and then into the corresponding micro-hole 18 in the lower die. Each assembly aid film is preferably at least semi-transparent so that it is possible to see each of lower die micro-holes 18 through the assembly film aid, thereby facilitating assembly. In embodiments where more than one assembly aid sheet is used or a polymer sheet is utilized, both the polymer sheet and one of the assembly aid sheets may be removed before inserting each of probe pins 14 through the remaining assembly aid sheet and into a corresponding micro-hole 18 in lower die portion 12. Then, the removed assembly aid film and polymer sheet are placed on top of the loaded probe-pins causing each probe head 28 to pass through the corresponding micro-holes on the assembly aid film and polymer sheet. This process continues until all of probe pins 14 are loaded.

The present invention offers a plurality of benefits and advantages over prior art designs. For example, the present invention design enhances the repair-ability of the die head. Repairs can be performed by simply removing the second assembly aid film and/or polyimide sheet, withdrawing a damaged probe pin through the oversized micro-hole in the first assembly aid film, re-inserting a new probe pin, and re-installing the second assembly aid film. There is no need to remove the upper die, no possibility for the assembly aid film to lift off the probe heads, and no tearing of the film.

The assembly process of the present invention described above offers several benefits over prior art assembly processes. First, it generally can be completed in approximately ⅓ the time required for conventional assembly. Next, because there is no longer any need to tie down the assembly aid film, there is no possibility for the film to lift off the probe heads. Also, it greatly reduces the likelihood of bending the probe pins, since the probe heads no longer have to be bent down and inserted upwards through the assembly aid film.

As described above for one embodiment of the present invention, after all of the probe pins have been loaded, the second assembly aid film having an array of smaller diameter micro-holes is aligned over the probe heads and lowered onto the surface of the first assembly aid film. The smaller micro-holes allow the probe pins to be held in close relative alignment to each other. In addition, since the second assembly aid film is generally not fixed to the die assembly, it allows free motion of the probe pins during probe pin compression while still maintaining their relative positions. The alignment of the second assembly aid film to the probe pins is much simpler than the upper die alignment of a conventional design because a) the second assembly aid film is preferably at least semi-transparent so the probe pins are always visible and b) it is not necessary that all the probe pins pass through all the micro-holes of the array simultaneously, but rather the second assembly aid film can be applied to sections of the array in stages.

A further advantage of the second assembly array film is evident in the lapping process. As described earlier, the lapping process generates debris. Since the second assembly aid film has small diameter, i.e., "tight," micro-holes, the lapping debris collects on the top of this film rather than passing into the head assembly. As the debris is on the outside of the assembly, it may be removed easily without requiring removal of the upper die. The second assembly aid film may even be removed entirely and replaced with a clean film.

The present invention also offers improvements over prior art designs in the area of thermal expansion. For high temperature test applications, the lower and upper dies are made from low coefficient of thermal expansion (CTE) materials in order to maintain alignment between the probe pins and the pads that they contact. The pads are typically located on materials having a low CTE. The low CTE materials may present challenges in terms of micro-drilling as compared to the conventional polyimide materials. In the present invention, the first assembly mounting film is bonded to metal foil having a low CTE, such one sold under the brand name Invar® or similar. The polyimide film has a higher CTE. However, since the film is very thin, e.g., 1 mil, it cannot support compressive forces. It therefore can not force the contacts apart as it expands, which would cause miss-alignment, but rather sags slightly, greatly alleviating the CTE miss-match problem for upper dies.

The drilling process of the present invention also offers improvements over prior art processes. The drilling of conventional upper dies is time consuming because the drilling process requires controlled feed rates and multiple passes in order to achieve good quality micro-holes and avoid drill breakage. In contrast, the assembly aid films according to the present invention can be punched or laser drilled at low cost and low lead time. Also, the films of the present invention offer opportunities for slotted holes, which provide advantages in very tight pitch applications, whereas conventional drilling processes are typically limited to round holes.

Although the invention has been described and illustrated with respect to exemplary embodiments thereof, it should be understood by those skilled in the art that the foregoing and various other changes, omissions and additions may be made therein and thereto, without parting from the spirit and scope of the present invention.

What is claimed is:

1. An upper die portion of a die head for aligning probe pins in a first array of first micro-holes formed in a lower die portion of the die head, comprising:
   a spacer portion including first and second surfaces, said first surface for contacting the lower die portion;
   a support frame; and
   a first assembly aid film attached with said second surface and said support frame and having a second array of second micro-holes for receiving the probe pins, wherein said first assembly aid film is not part of a laminate; and
   a second assembly aid film proximal to said first assembly aid film and having a third array of third micro-holes for receiving the probe pins;
   a thin shim around an outer perimeter of said third array; and
   a sheet having over-sized micro-holes, said sheet positioned on top of said second assembly aid film.

2. An upper die portion according to claim 1, wherein said second and third arrays are offset from the first array.

3. An upper die portion according to claim 1, further comprising:
   a sheet having over-sized micro-holes, said sheet positioned on top of said first assembly aid film.

4. An upper die portion according to claim 1, wherein said spacer portion includes at least first and second separateable portions.

5. An upper die portion according to claim 1, wherein both of said first and second assembly aid films are at least semi-transparent.

6. An upper die portion according to claim 1, wherein each of the micro-holes of said third array of third micro-holes has a diameter that is selected so that each of the micro-holes of said third array of third micro-holes is substantially sealed when the probe pins are inserted.

7. An upper die portion according to claim 1, wherein said second assembly aid film is not fixed to said support frame.

8. An upper die portion according to claim 1, wherein said first assembly aid film is bonded to said support frame.

9. An upper die portion according to claim 1, wherein each of the micro-holes of said third array of third micro-holes has a diameter that is selected so that debris is substantially prevented from passing through said third micro-holes.

10. An upper die portion according to claim 1, wherein said first assembly aid film is at least partially fabricated from a material having a low coefficient of thermal expansion.

11. A die head including alignment mechanisms for aligning probe pins in the die head, comprising:
a lower die portion having multiple surfaces, at least one of said multiple surfaces having a first array of first micro-holes for receiving the probe pins;
an upper die portion having a spacer portion, a support frame, and a first assembly aid film, said spacer portion including first and second surfaces, said first surface in contact with at least one of said multiple surfaces of said lower die portion, said first assembly aid film attached with said second surface and said support frame, said first assembly aid film having a second array of second micro-holes for receiving the probe pins, wherein said first assembly aid film is not part of a laminate;
a second assembly aid film in contact with said first assembly aid film, said second assembly aid film having a third array of third micro-holes for receiving the probe pins;
a thin shim around an outer perimeter of said third array; and
a sheet having over-sized micro-holes, said sheet positioned on top of said second assembly aid film.

12. A die head according to claim 11, wherein said second and third arrays are offset from the first array.

13. An upper die portion according to claim 11, further comprising:
a sheet having over-sized micro-holes, said sheet positioned on top of said first assembly aid film.

14. A die head according to claim 11, wherein said spacer portion includes at least first and second separateable portions.

15. A die head according to claim 11, wherein both of said first and second assembly aid films are at least semi-transparent.

16. A die head according to claim 11, wherein said second assembly aid film is not fixed to the support frame.

17. A die head according to claim 11, wherein said first assembly aid film is bonded to said support frame.

18. A die head according to claim 11, wherein said first assembly aid film is at least partially fabricated from a material having a low coefficient of thermal expansion.

19. An upper die portion of a die head for aligning probe pins in a first array of first micro-holes formed in a lower die portion of the die head, comprising:
a spacer portion including first and second surfaces, said first surface adapted to contact the lower die portion;
a first support frame positioned above said second surface;
an assembly aid film having a second array of second micro-holes adapted to receive the probe pins, wherein said assembly aid film is not part of a laminate;
a second support frame positioned above said first support frame and said assembly aid film; and
a sheet joined with said second support frame and having a third array of third micro-holes adapted to receive the probe pins;
wherein said assembly aid film is prevented from moving in either an axial or lateral direction.

20. An upper die portion according to claim 19, wherein said second and third arrays are adapted to be offset from the first array.

21. An upper die portion according to claim 19, wherein said sheet has over-sized micro-holes.

22. An upper die portion according to claim 19, wherein said spacer portion includes at least first and second separateable portions.

23. An upper die portion according to claim 19, further comprising a second assembly aid film in contact with said first assembly aid film, said second assembly aid film having a fourth array of fourth micro-holes adapted to receive the probe pins.

24. An upper die portion according to claim 19, further comprising means for reducing expansion of said assembly aid film.

25. A method of replacing a probe pin in a die head having upper and lower portions, comprising the steps of:
providing an upper die portion that includes an assembly aid film that is not part of a laminate;
grasping the probe pin;
removing the probe pin from the die head by pulling the probe pin upwardly and out of the upper and lower portions; and
inserting a probe pin in the same location as the probe pin removed in said removing step by inserting the probe pin downwardly through both upper and lower portions.

* * * * *